(12) United States Patent
Misek et al.

(10) Patent No.: US 8,704,532 B2
(45) Date of Patent: Apr. 22, 2014

(54) SYSTEM AND METHOD FOR DETERMINING POWER SUPPLY NOISE IN AN INTEGRATED CIRCUIT

(75) Inventors: Brian J. Misek, Fort Collins, CO (US); Aaron Volz, Broomfield, CO (US); Evan Beauprez, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 401 days.

(21) Appl. No.: 12/967,096

(22) Filed: Dec. 14, 2010

(65) Prior Publication Data

US 2012/0146665 A1    Jun. 14, 2012

(51) Int. Cl.
G01R 29/26    (2006.01)
G01R 31/26    (2014.01)

(52) U.S. Cl.
CPC ............ G01R 29/26 (2013.01); *G01R 31/2646* (2013.01)
USPC .......................................................... 324/613

(58) Field of Classification Search
CPC ............................ G01R 29/26; G01R 31/2646
USPC .......................................................... 324/613
See application file for complete search history.

(56) References Cited

U.S. PATENT DOCUMENTS

| | | | | |
|---|---|---|---|---|
| 4,829,590 A * | 5/1989 | Ghose | ........................... | 455/63.1 |
| 7,279,907 B2 * | 10/2007 | Phoon et al. | .................. | 324/628 |
| 7,469,391 B2 * | 12/2008 | Carrere et al. | ................ | 716/115 |
| 7,595,679 B1 | 9/2009 | Popovich et al. | | |
| 7,809,517 B1 * | 10/2010 | Zuckerman | ...................... | 702/72 |
| 7,983,880 B1 * | 7/2011 | Fender et al. | ...................... | 703/2 |
| 2006/0017511 A1 * | 1/2006 | Puma et al. | ...................... | 331/16 |
| 2006/0190878 A1 * | 8/2006 | Rius Vazquez et al. | ........... | 716/6 |
| 2007/0132480 A1 * | 6/2007 | Aoki | ............................. | 324/771 |

OTHER PUBLICATIONS

Kim, Jingook et al.; Analysis of Noise Coupling From a Power Distribution Network to Signal Traces in High-Speed Multilayer Printed Circuit Boards; IEEE Transactions on Electromagnetic Compatibility; vol. 48, Issue 2, pp. 319-330; May 2006.
Alon, E. et al.; On-Die power Supply Noise Measurement Techniques; IEEE Transactions on Advanced Packaging; vol. 32, Issue 2, pp. 248-259; May 8, 2009.
Iliya Zamek et al.; Modeling FPGA Current Waveform and Spectrum and PDN Noise Estimation; Department of Electrical engineering, University of Missouri-Rolla, Feb. 2008.
Alon, Elad et al., "Circuits and Techniques for High-Resolution Measurement of On-Chip Power Supply Noise", *Department of Electrical Engineering, Stanford University 2004 Symposium on VLSI Circuits Digest of Technical Papers* 2004.

* cited by examiner

*Primary Examiner* — Jeff Natalini

(57) ABSTRACT

A system for determining power supply noise in an integrated circuit includes a circuit system comprising a circuit element and a power delivery network, the power delivery network comprising at least one impedance, a channel formed by input and output portions of the circuit element, the channel having the impedance of the power delivery network, a signal source for providing an aggressor signal having a known spectrum to the input portion of the circuit element, and an analysis device for measuring the aggressor signal at the output portion of the circuit element, whereby the aggressor signal at the output portion of the circuit element is influenced by the impedance of the power delivery network and indicates power supply noise.

18 Claims, 6 Drawing Sheets

SYSTEM AND METHOD FOR DETERMINING POWER SUPPLY NOISE IN AN INTEGRATED CIRCUIT

BACKGROUND

A modern application specific integrated circuit (ASIC) employs a complex power delivery network (PDN) to deliver electrical power to the active circuit elements on the IC die. One of the challenges when delivering electrical power to an integrated circuit die is that there are various capacitive couplings between the printed circuit board (PCB) and the circuit package, and between the circuit package and the circuit die. A primary problem is determining and controlling the transfer of noise from the PCB to the die over the power delivery network.

Previous solutions for determining the amount of noise transferred from a PCB to a circuit die included modifying the system under test by removing bypass capacitors or by using high power radio frequency (RF) amplifiers to drive the power delivery network so as to couple sufficient energy into the PDN to allow and observe perturbation of the on-die PDN. Unfortunately, these solutions have the unwanted effect of altering the impedance of the power delivery network, thereby skewing any measurements.

Therefore, it would be desirable to have a way of determining the effects of the power delivery network of an integrated circuit die that overcomes the above-mentioned shortcomings.

SUMMARY

In an embodiment, a system for determining power supply noise in an integrated circuit includes a circuit system comprising a circuit element and a power delivery network, the power delivery network comprising at least one impedance, a channel formed by input and output portions of the circuit element, the channel having the impedance of the power delivery network, a signal source for providing an aggressor signal having a known spectrum to the input portion of the circuit element, and an analysis device for measuring the aggressor signal at the output portion of the circuit element, whereby the aggressor signal at the output portion of the circuit element is influenced by the impedance of the power delivery network and indicates power supply noise.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

A system and method for determining power supply noise in an integrated circuit can be implemented using a variety of circuit elements and types that may be fabricated on a circuit board, circuit package, circuit die configuration. Such a configuration can be referred to as a "circuit system" for simplicity. However, other nomenclature may be used. In an embodiment, the system and method for determining power supply noise in an integrated circuit can be described in the context of using portions of a serializer/deserializer (SERDES) circuit as a path to inject a known signal and observe a response of a power delivery network associated with the SERDES. In an embodiment, the transmit (TX) channel of a SERDES provides a low loss, high fidelity, well controlled impedance channel over which to inject an aggressor signal and measure the response of the power delivery network. However, the system and method for determining power supply noise in an integrated circuit can be implemented using other circuit types and elements.

Figure 1:
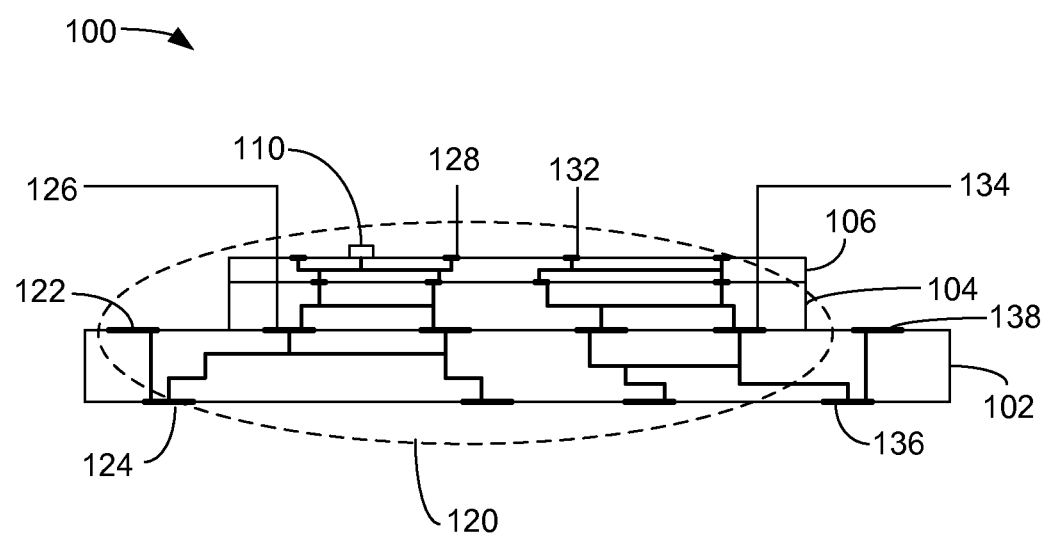
FIG. 1 is a schematic diagram illustrating a power delivery network in a circuit system including a circuit board, a circuit package and a circuit die.

FIG. 1 is a schematic diagram illustrating an example of a portion of a power delivery network in a circuit system including a circuit board, a circuit package and a circuit die. The circuit system 100 generally includes a printed circuit board (PCB) 102 over which a circuit package 104 is assembled. A circuit die 106, which is sometimes also referred to as a "chip" is assembled over the circuit package 104. A circuit element 110 is located on the circuit die 106. In an embodiment, the circuit element 110 can be a serializer/deserializer (SERDES); however, other circuit structures can also be implemented. A single circuit element 110 is shown for example purposes only. Many other circuit elements are typically fabricated on the circuit die 106.

The circuit system 100 is illustrated as a high-level schematic diagram to simplify the drawing and to illustrate that any circuit system 100 can be used to implement the system and method for determining power supply noise in an integrated circuit. In an embodiment, the circuit system 100 includes a power delivery network (PDN) 120. The power delivery network 120 is schematically shown as providing electrical interconnects for power and ground throughout the circuit board 102, the circuit package 104 and the circuit die 106 so that electrical power can be provided to the circuit element 110. An analog voltage is applied to the power delivery network 120 to provide power to the circuit element 110. The analog voltage will be generally referred to using the nomenclature VDD. Analog ground connections are also made throughout the circuit system 100 and will be generally referred to as GND.

As an example, an analog voltage VDD can be applied to the circuit board 102 at a pad 124, where the voltage is referred to as the "board VDD." The circuit board 102 also includes a probe pad 122 through which it is possible to sense various electrical parameters of the power delivery network and the circuit element 110. The circuit board 102 also includes a board ground pad 136 at which the "board GND" can be connected and a pad 138, at which the ground signal can be sensed.

The circuit package 104 includes a pad 126 at which point the "circuit VDD" signal can be sensed and a pad 134 at which point the "package GND" signal can be sensed. The circuit die 106 includes a pad 128 at which point the "die VDD" signal can be sensed and a pad 132 at which point the "die GND" signal can be sensed.

The voltage and ground pads on the circuit board 102, circuit package 104 and circuit die 106 are all locations between which various impedances exist within the power delivery network 120. These impedances affect the noise and system response of the power delivery network 120, and can be characterized using embodiments of the system and method for determining power supply noise in an integrated circuit to be described below.

The system and method for determining power supply noise in an integrated circuit can be used to measure the noise present in the power delivery network using what is referred to as an "aggressor" signal that is applied, also referred to as "injected," to a SERDES transmit channel and measuring a response in a victim SERDES transmit channel. As will be described in greater detail below, a known injected noise signal is applied to the power delivery network 120. The known injected noise signal traverses a SERDES transmit channel. The injected noise signal interacts with the impedances in the power delivery network 120 and creates a response in the victim SERDES transmit channel. The response of the SERDES transmit channel is measured to determine the on-die power supply voltage noise (analog VDD noise of the PDN, typically in dBm or Vrms) caused by the aggressor signal. The SERDES transmit channel is then modulated with a known bit pattern at the Nyquist rate to produce a carrier tone. A phase noise of the carrier tone is analyzed at the aggressor frequency offset. A phase noise (typically in dBc) is isolated from the aggressor frequency offset and the phase noise is integrated to obtain a noise jitter value. A transfer function, also referred to as a sensitivity function, of the SERDES transmit channel is developed by taking a ratio of the phase noise over the analog VDD. The sensitivity function indicates the sensitivity of the SERDES channel and provides an indication of the noise of the power delivery network.

Figure 2:
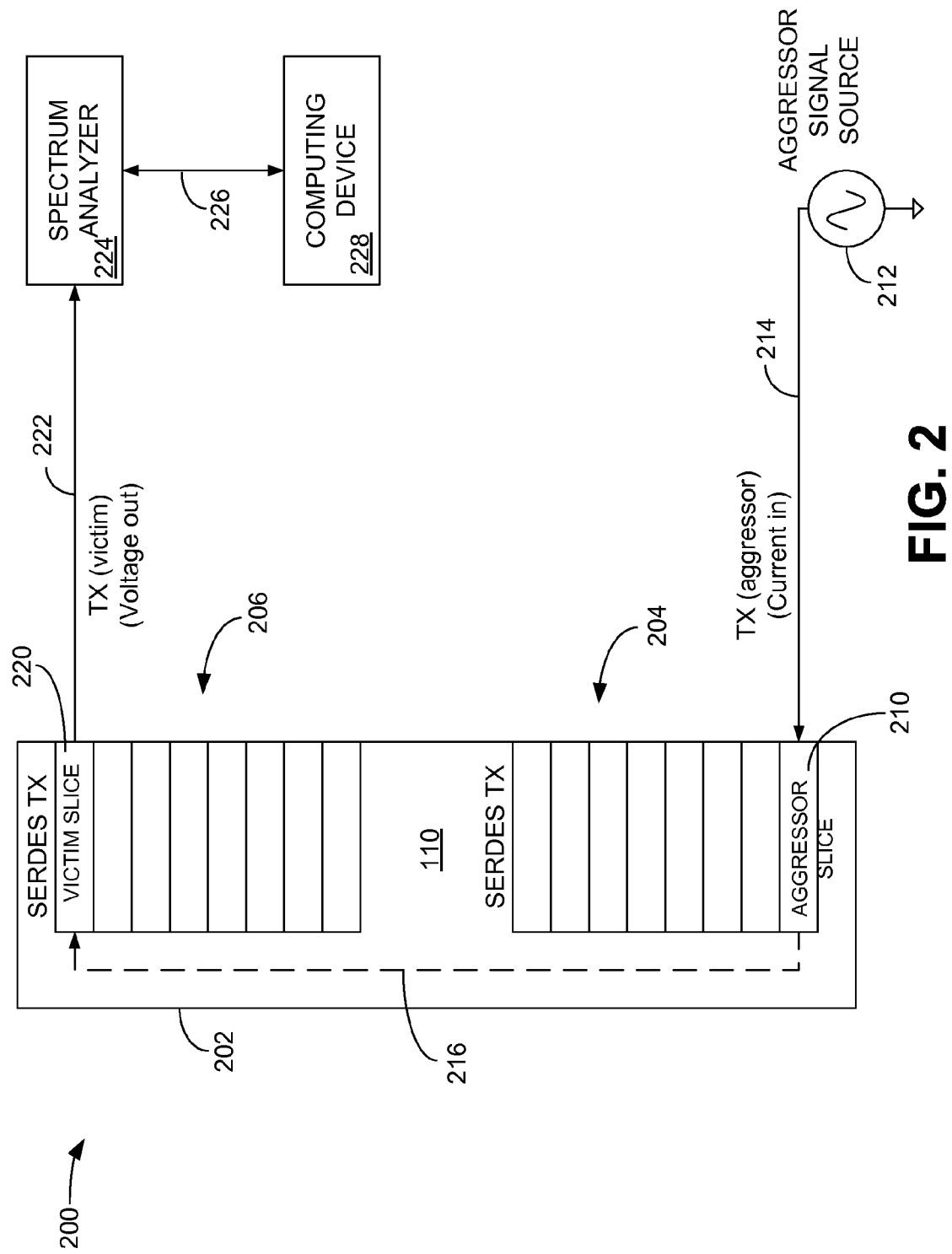
FIG. 2 is a schematic diagram illustrating an embodiment of a system for determining power supply noise in an integrated circuit.

FIG. 2 is a schematic diagram illustrating an embodiment of a system for determining power supply noise in an integrated circuit. The system 200 comprises a device under test (DUT) 202, which, in an embodiment, can comprise at least portions of the SERDES 110 of FIG. 1. The SERDES 110 generally comprises a number of transmit channels and receive channels. The receive channels are not shown for simplicity. The SERDES 110 includes a number of transmitters, each including a number of channels. Example SERDES transmit channels are shown using reference numerals 204 and 206. Each of the SERDES transmit channels are referred to as a "slice." Because an aggressor signal is applied to one of the TX slices and a response is measured at another TX slice, one of the TX slices will be referred to as an "aggressor slice," and another TX slice will be referred to as a "victim slice." This nomenclature is for example purposes only. Any of the SERDES transmit slices can be used as either an aggressor slice or a victim slice. For purposes of illustration only, an aggressor slice is shown using reference numeral 210 and a victim slice is shown using reference numeral 220. The aggressor slice 210 (also referred to as an aggressor channel) and the victim slice 220 (also referred to as a victim channel) are electrically connected through the power delivery network 120 (FIG. 1). The connection between the aggressor slice 210 and the victim slice 220 is schematically illustrated in FIG. 2 using a channel 216, but can also include at least portions of the power delivery network 120 (FIG. 1). Further, in an embodiment, the power delivery network 120 and the channel 216 can be functionally equivalent. Although illustrated schematically as a dotted line, the channel 216 is formed by a combination of the impedances (to be described in detail in FIG. 3) that comprise the power delivery network 120 of FIG. 1. An aggressor SERDES transmit channel is used to inject the aggressor signal and a victim SERDES transmit channel is used to measure a response because a SERDES transmit path provides a channel having low loss, high fidelity, and a well-controlled impedance over a wide frequency spectrum.

The system 200 also comprises an aggressor signal source 212. The signal provided from the aggressor signal source 212 can be, in an embodiment, an input current that is provided over connection 214 to the aggressor slice 210 in the SERDES 110. Although shown as a single-ended signal, the aggressor signal provided by the aggressor signal source 212 can also be a differential signal. In an embodiment, a current signal is provided by the aggressor signal source 212. However, a Thevenin equivalent of a voltage source and a terminating resistance can also be used with equivalence. The aggressor current signal is provided to the aggressor slice 210 and converted by the channel 216 to a voltage signal that is measured at the victim slice 220.

In accordance with an embodiment of the system and method for determining power supply noise in an integrated circuit, an aggressor signal is applied over connection 214 to the aggressor slice 210. The signal traverses the channel 216 where it is measured at the victim slice 220 over connection 222. The signal on connection 222 is provided to a spectrum analyzer 224 that is used to measure the response of the channel 216. A computing device 228 is coupled to the spectrum analyzer 226 to perform computations on the noise within the victim slice 220 to determine the power supply noise.

Figure 3:
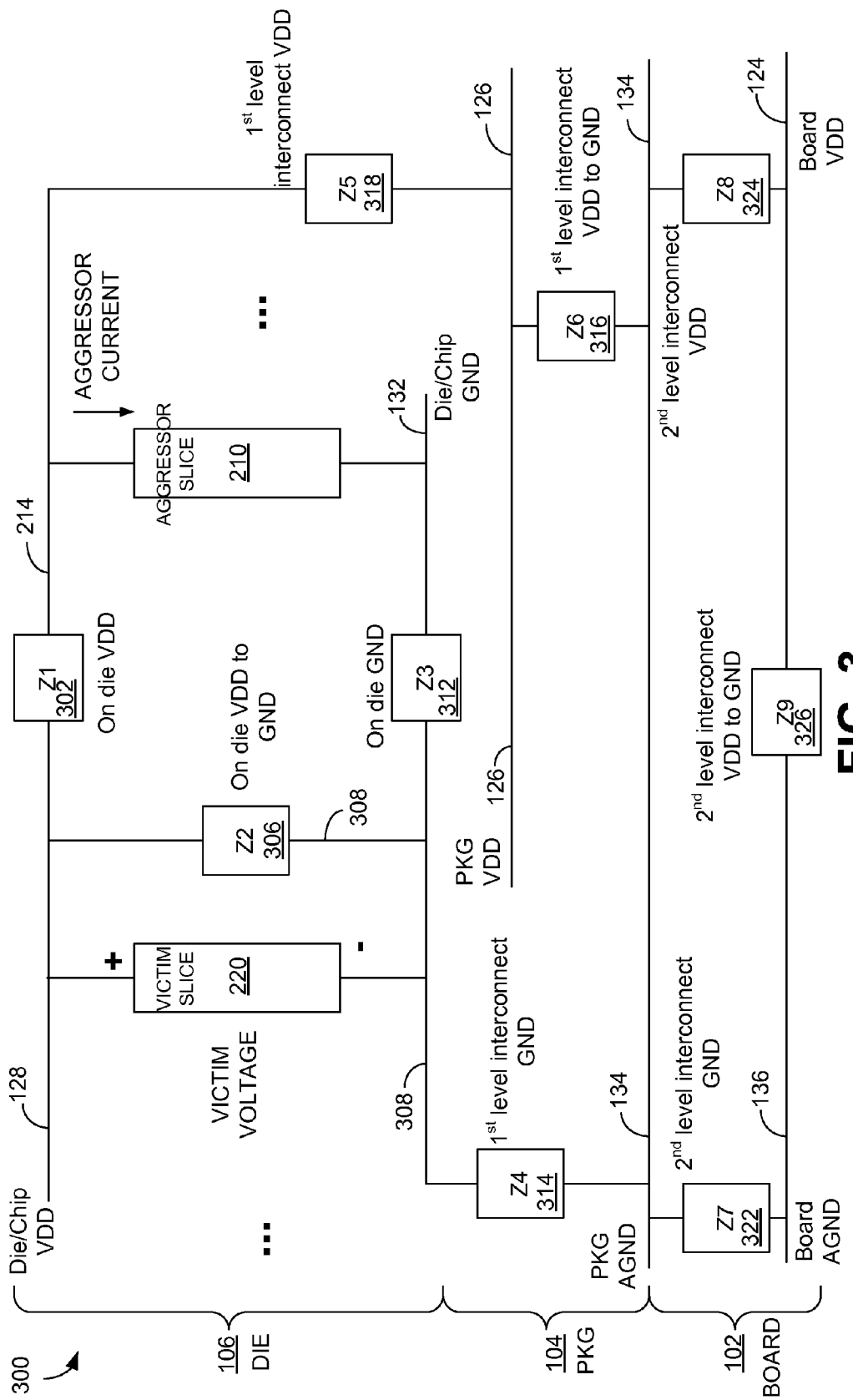
FIG. 3 is a schematic diagram illustrating a conceptual view of the impedances present in a power delivery network on an integrated circuit.

FIG. 3 is a schematic diagram illustrating a conceptual view of the impedances present in a power delivery network for an integrated circuit. The schematic diagram 300 is intended to schematically illustrate the impedances present in the power delivery network 120 on the circuit board 102, the circuit package 104 and the circuit die 106 (FIG. 1). While these impedances are shown as series and shunt impedances for convenience, it is understood that these impedances are complex, mesh circuits. The impedances (referred to as impedances Z1 through Z9), are schematically illustrated in their respective locations on the circuit board 102, the circuit package 104 and the circuit die 106. The aggressor slice 210 is schematically shown between a connection 214 and the chip GND pad 132. The connection 214 is shown relative to an impedance, Z1, 302, an impedance Z2, 306 and an impedance, Z5, 318. The impedance Z1, 302, refers to the on-die series VDD impedance. The impedance, Z2, 306, refers to the shunt impedance between the die VDD pad 128 and the connection 308. The impedance, Z5, 318, refers to the first level interconnect VDD impedance between the circuit package VDD pad 126 and the connection 214. The interconnect represented by the impedance Z5, 318 can be, for example, C4 bumps, wirebonds, or another chip to package interconnect.

The victim slice 220 is schematically shown between the die VDD pad 128 and the connection 308. The connection 308 is between an impedance Z3, 312, and an impedance Z4, 314. The impedance Z3, 312, refers to the on-die GND series impedance. The impedance Z4, 314, refers to the first level interconnect GND impedance between the circuit package GND pad 134 and the connection 308. As mentioned in FIGS. 1 and 2, a single-ended aggressor signal is applied over connection 214 and a single-ended victim signal is measured on connection 128 (shown as 222 in FIG. 2). However, in a differential-signal application, the spectrum of the victim slice 220 would be measured across connections 128 and 308.

An impedance Z6, 316, refers to the first level interconnect impedance between the circuit package VDD pad 126 and the circuit package GND pad 134.

The impedances on the circuit board 102 are shown as impedances Z7, Z8 and Z9. The impedance, Z7, 322, refers to the impedance between the circuit board GND pad 136 and the circuit package GND pad 134. The impedance Z8, 324, refers to the impedance between the circuit board VDD pad 124 and the circuit package GND pad 134. The impedance, Z9, 326, refers to the impedance between the circuit board VDD pad 124 and the circuit board GND pad 136.

The combination of the impedances Z1 through Z9 represent all of the impedances in the power delivery network 120 shown in FIG. 1. In accordance with an embodiment of the system and method for determining power supply noise in an integrated circuit, the aggressor signal in the form of an aggressor current is applied to the aggressor slice 210 over connection 214. The aggressor current flowing through the aggressor slice 210 provides the stimulus to the power delivery network 120 (FIG. 1) to generate a noise voltage across the victim slice 220. The aggressor signal traverses the entire power delivery network 120 (impedances Z1 through Z9), where it is measured as a voltage across the victim slice 220. In a single-ended implementation, the voltage measurement is provided over connection 128 (corresponding to connection 222 in FIG. 2) to the spectrum analyzer 224 (FIG. 2), where it is analyzed as will be described below. In a differential implementation, the voltage measurement is taken across connections 128 and 308 and provided to the spectrum analyzer 224 (FIG. 2).

Figure 4B:
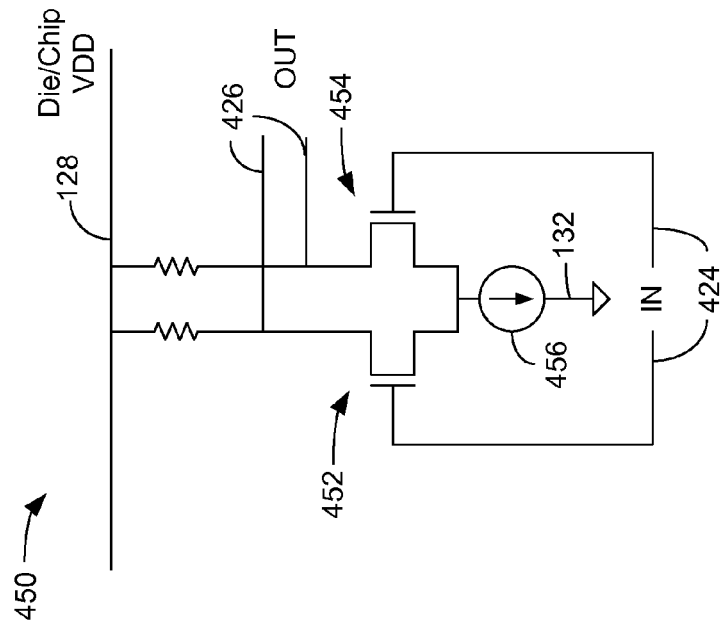
FIGS. 4A and 4B are schematic diagrams illustrating embodiments of circuit architecture used by the system for determining power supply noise in an integrated circuit of FIG. 2.
Figure 4A:
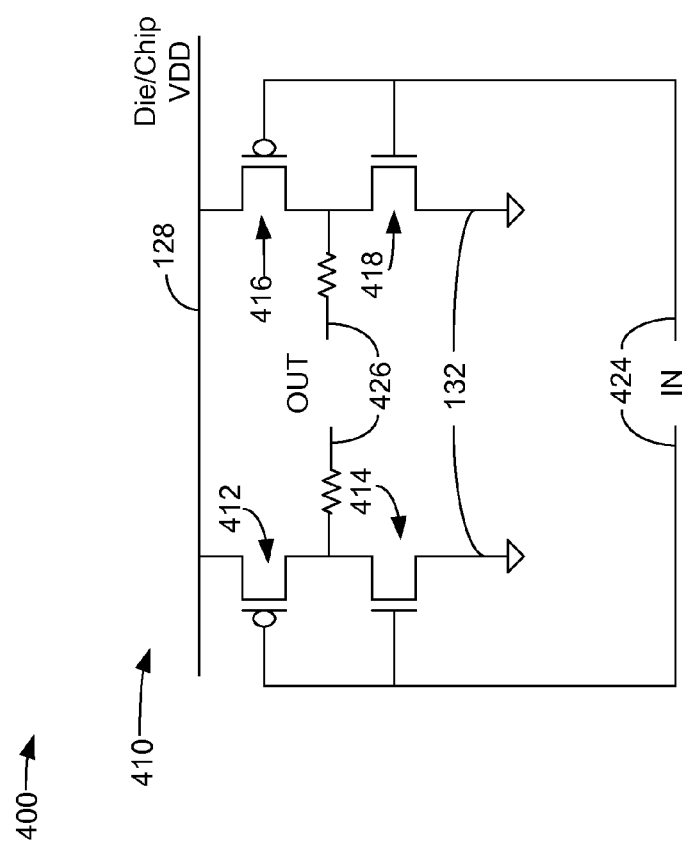

FIGS. 4A and 4B are schematic diagrams illustrating embodiments of circuit architecture used by the system for determining power supply noise in an integrated circuit of FIG. 2. The circuit elements shown in FIGS. 4A and 4B are embodiments of the circuit element 110 of FIG. 1.

FIG. 4A shows a circuit element 410 arranged as sourced coupled logic. A transistor device 412 is coupled to a transistor device 414. The transistor device 412 is coupled to the circuit die VDD pad 128. The transistor device 414 is coupled to the circuit die GND pad 132.

A transistor device 416 is coupled to a transistor device 418. The transistor device 416 is coupled to the circuit die VDD pad 128. The transistor device 418 is coupled to the circuit die GND pad 132. The aggressor current is injected through the output connection 426 of the aggressor slice 210 (FIG. 2). Therefore, the aggressor current enters the aggressor slice 210 (FIG. 2) through connection 426 (corresponding to single-ended connection 214 in FIG. 2) and the response is measured at a corresponding connection 426 (corresponding to single-ended connection 222 in FIG. 2) at the victim slice 220. When the VDD of the victim slice 220 is measured to determine its response to the aggressor current, the input connection 424 is set such that the response can be measured at connection 128, through the transistor devices 416 and 412.

FIG. 4B shows a circuit element 450 arranged as current mode logic. Transistor devices 452 and 454 are coupled to the circuit die VDD pad 128 and to a current source 456. The transistors are coupled to the circuit die VDD pad 128. The current source 456 is coupled to the circuit die GND pad 132. A differential input signal is provided over connection 424 to the gate terminals of the devices as shown. A differential output signal is provided over connection 426.

Figure 5A:
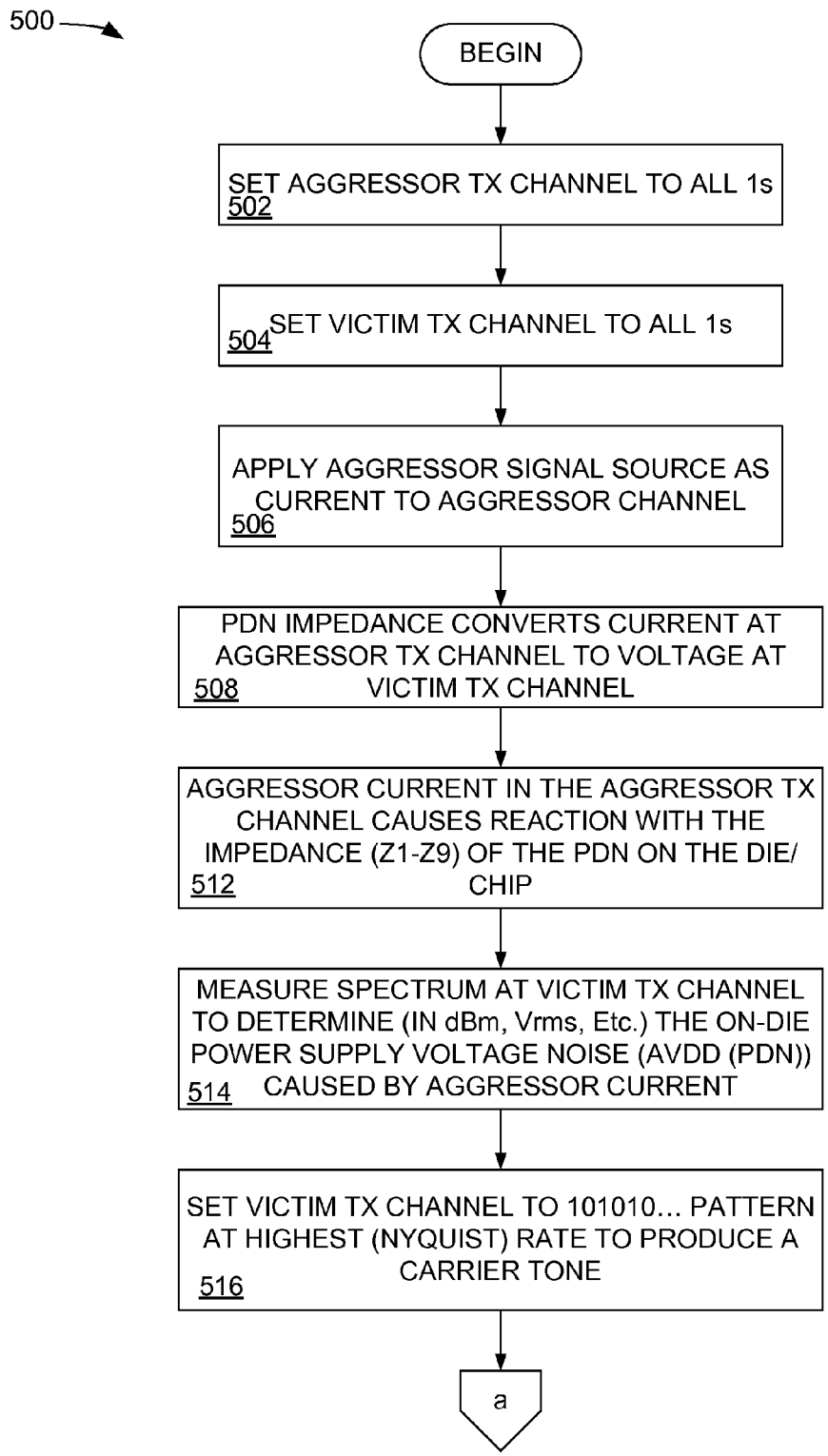
FIGS. 5A and 5B collectively illustrate a flowchart showing an embodiment of a method for determining power supply noise in an integrated circuit.
Figure 5B:
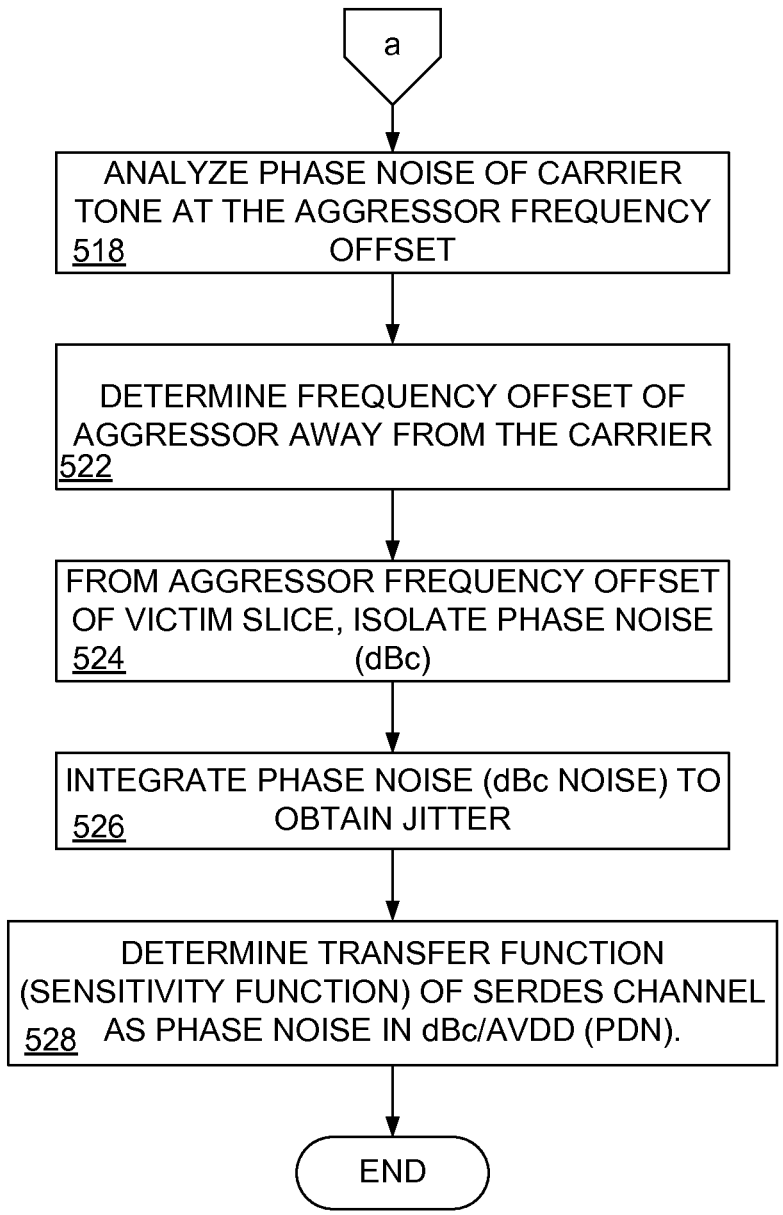

FIGS. 5A and 5B collectively illustrate a flowchart showing an embodiment of a method for determining power supply noise in an integrated circuit. In block 502, the aggressor slice 210 is set to all logic 1s or all logic 0s. This can be accomplished by applying the appropriate signals to connection 424 (FIGS. 4A and 4B). In block 504, the victim slice 220 is set to all logic 1s or all logic 0s in a similar fashion.

In block 506, and aggressor signal is applied to the power delivery network 120 (FIG. 1) over connection 214 via the aggressor slice 210 and the channel 216 (FIG. 2). In an embodiment, the power delivery network 120 and the channel 216 are functionally equivalent. All possible aggressor signal energy is transferred to the aggressor slice 210 and the channel 216.

In block 508, the approximate impedance of the channel 216 (e.g., the impedances Z1 through Z9 of the power delivery network 120) converts the current at the aggressor slice 210 to a voltage at the victim slice 220.

In block 512, the aggressor signal has a known spectrum and causes a reaction with the impedances Z1 through Z9 of the power delivery network 120.

In block 514, the spectrum analyzer 224 measures the victim signal spectrum at the victim slice 220 to determine the on-die power supply analog voltage noise (VDD (PDN)) caused by the aggressor signal. The spectrum is typically provided in an analog format such as dBm, $V_{RMS}$, etc. This spectrum represents the voltage domain noise of the power delivery network as excited by the aggressor signal on connection 214.

In block 516, the victim slice 220 is modulated with a 101010 . . . bit pattern at the highest (Nyquist) rate to produce a carrier tone. The modulating signal is applied to the logic inputs 424 (FIG. 4A or 4B) and is generated using circuitry (not shown) that is internal to the circuit system 100 (FIG. 1).

In block 518, the spectrum analyzer 224 analyzes the phase noise of the carrier tone at the aggressor frequency offset developed in block 516.

In block 522, the frequency offset of the aggressor away from the carrier is determined by the spectrum analyzer 224.

In block 524, the phase noise (in dBc) associated with the aggressor frequency offset of the victim slice is isolated by the spectrum analyzer 224.

In block 526, the phase noise determined in block 524 is integrated in the computing device 228 to obtain a jitter value.

In block 528 a transfer function of the SERDES channel is developed. The transfer function is the phase noise (block 524) over the on-die power supply analog voltage noise (VDD (PDN)) of the power delivery network (block 514), and is computed by the computing device 228. The transfer function corresponds to the sensitivity of the channel and is an indicator of the noise present in the power delivery network.

This disclosure describes the invention in detail using illustrative embodiments. However, it is to be understood that the invention defined by the appended claims is not limited to the precise embodiments described.

What is claimed is:

1. A system for determining power supply noise in an integrated circuit, comprising:
    a circuit system comprising a circuit element and a power delivery network, the power delivery network comprising at least one impedance;
    a channel formed by input and output portions of the circuit element, the channel having the impedance of the power delivery network;
    a signal source external to the circuit element for providing an aggressor signal having a known spectrum to the input portion of the circuit element;
    a modulator for modulating the output portion of the circuit element to develop a carrier tone; and an analysis device for measuring the aggressor signal at the output portion of the circuit element, whereby the aggressor signal at the output portion of the circuit element is influenced by the impedance of the power delivery network and indicates power supply noise, and wherein the analysis device further analyzes the phase noise of the carrier tone.

2. The system of claim 1, wherein the analysis device determines a frequency offset of the aggressor signal away from the carrier tone.

3. The system of claim 2, wherein the analysis device isolates a phase noise of the frequency offset of the aggressor signal.

4. The system of claim 3, wherein the analysis device integrates the phase noise to obtain a jitter value.

5. The system of claim 4, wherein the analysis device determines a transfer function based on the phase noise and the power supply noise.

6. The system of claim 5, wherein the transfer function corresponds to a sensitivity function representing the power supply noise.

7. A method for determining power supply noise in an integrated circuit, comprising:
 providing a power delivery network for a circuit system, the circuit system comprising at least one circuit element, the power delivery network comprising at least one impedance;
 forming a channel comprising input and output portions of the circuit element, the channel having the impedance of the power delivery network;
 providing an aggressor signal having a known spectrum from a source external to the circuit element to the input portion of the circuit element;
 modulating the output portion of the circuit element to develop a carrier tone;
 measuring the aggressor signal at the output portion of the circuit element, whereby the aggressor signal at the output portion of the circuit element is influenced by the impedance of the power delivery network and indicates power supply noise and;
 analyzing the phase noise of the carrier tone.

8. The method of claim 7, further comprising determining a frequency offset of the aggressor signal away from the carrier tone.

9. The method of claim 8, further comprising isolating a phase noise of the frequency offset of the aggressor signal.

10. The method of claim 9, further comprising integrating the phase noise to obtain a jitter value.

11. The method of claim 10, further comprising determining a transfer function based on the phase noise and the power supply noise.

12. The method of claim 11, wherein the transfer function corresponds to a sensitivity function representing the power supply noise.

13. A system for determining power supply noise in a serializer/deserializer (SERDES) integrated circuit, comprising:
 a circuit system comprising a SERDES integrated circuit element and a power delivery network, the power delivery network comprising at least one impedance;
 a channel formed by input and output portions of the SERDES integrated circuit element, the channel having the impedance of the power delivery network;
 a signal source external to the circuit element for providing an aggressor signal having a known spectrum to the input portion of the circuit element;
 a modulator for modulating the output portion of the circuit element to develop a carrier tone; and
 an analysis device for measuring the aggressor signal at the output portion of the circuit element, whereby the aggressor signal at the output portion of the SERDES integrated circuit element is influenced by the impedance of the power delivery network and indicates power supply noise, and wherein the analysis device further analyzes the phase noise of the carrier tone.

14. The system of claim 13, wherein the analysis device determines a frequency offset of the aggressor signal away from the carrier tone.

15. The system of claim 14, wherein the analysis device isolates a phase noise of the frequency offset of the aggressor signal.

16. The system of claim 15, wherein the analysis device integrates the phase noise to obtain a jitter value.

17. The system of claim 16, wherein the analysis device determines a transfer function based on the phase noise and the power supply noise.

18. The system of claim 17, wherein the transfer function corresponds to a sensitivity function representing the power supply noise.

* * * * *